(12) United States Patent
Korovin

(10) Patent No.: US 6,951,597 B2
(45) Date of Patent: Oct. 4, 2005

(54) DYNAMIC POLISHING FLUID DELIVERY SYSTEM FOR A ROTATIONAL POLISHING APPARATUS

(75) Inventor: Nikolay N. Korovin, Phoenix, AZ (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 10/698,765

(22) Filed: Oct. 31, 2003

(65) Prior Publication Data

US 2005/0092434 A1 May 5, 2005

(51) Int. Cl.[7] .................. B24B 37/00; B24B 57/02; H01L 21/304
(52) U.S. Cl. ................... 156/345.13; 451/66
(58) Field of Search .................. 156/345.12, 345.13; 451/66

(56) References Cited

U.S. PATENT DOCUMENTS 6,503,361 B1 * 1/2003 Nyui et al. ............ 156/345.13
6,572,445 B2 * 6/2003 Laursen ...................... 451/10
6,652,366 B2 * 11/2003 Dyer ........................... 451/60
6,722,949 B2 * 4/2004 Hu et al. ....................... 451/36

FOREIGN PATENT DOCUMENTS

JP 10094965 A * 4/1998 ........... B24B/57/02
JP 11077516 A * 3/1999 ........... B24B/37/00

* cited by examiner

Primary Examiner—Parviz Hassenzadeh
Assistant Examiner—Sylvia R. MacArthur
(74) Attorney, Agent, or Firm—Ingrassia Fisher & Lorenz PC

(57) ABSTRACT

Methods and apparatus are provided for performing a chemical-mechanical process on a workpiece surface. The apparatus includes a platen having a top surface and at least one inlet configured to receive a polishing fluid, a plurality of holes formed in the top surface, a manifold system in fluid communication with the at least one inlet and each of the holes, a controller adapted to supply valve command signals, and a plurality of valves, each valve being disposed in one of the holes and coupled to the controller to receive the valve command signals and being operable, in response thereto, to selectively move between an open and a closed position. The method includes the steps of supplying the valve command signals, and selectively opening and closing the valves in response to the valve command signals.

18 Claims, 4 Drawing Sheets

DYNAMIC POLISHING FLUID DELIVERY SYSTEM FOR A ROTATIONAL POLISHING APPARATUS

TECHNICAL FIELD

The present invention relates to chemical-mechanical polishing devices. More particularly, the present invention relates to wafer planarization enhancement through improved polishing fluid distribution on a polishing pad.

BACKGROUND OF THE INVENTION

Chemical-mechanical polishing (CMP) is the process of removing projections and other imperfections from a semiconductor wafer to create a smooth planar surface. The wafer is the basic substrate material in the semiconductor industry for the manufacture of integrated circuits. Wafers are typically created by growing an elongated cylinder or boule of single crystal silicon and then slicing individual wafers from the cylinder. Slicing causes both faces of the wafer to be somewhat rough. Planarization is desirable because the front face of the wafer on which integrated circuitry is to be constructed must be substantially flat in order to facilitate reliable semiconductor junctions with subsequent layers of material applied to the wafer. Composite thin film layers comprising metals for conductors or oxides for insulators must also be made of a uniform thickness if they are to be joined to the semiconductor wafers or to other composite thin film layers.

Planarization is typically completed before performing lithographic processing steps that create integrated circuitry or interconnects on the wafer. Non-planar surfaces result in poor optical resolution of subsequent photolithographic processing steps which in turn hinders high-density features from being adequately printed. If a metallization step height is too large, open circuits will likely be created. Consequently, CMP tools are continually being improved upon with an aim toward controlling wafer planarization.

In a conventional CMP assembly the wafer is secured in a carrier connected to a shaft. The shaft is typically connected to a transporter that moves the carrier between a load or unload station and a position adjacent to a polishing pad. One side of the polishing pad has a polishing surface thereon, and an opposite side is mounted to a rigid platen. Pressure is exerted on a wafer back surface by the carrier in order to press a wafer front surface against the polishing pad. Polishing fluid is introduced onto the polishing surface while the wafer and/or polishing pad are moved in relation to each other by means of motors connected to the shaft and/or platen. The above combination of chemical and mechanical stress results in removal of material from the wafer front surface. One requisite for removing wafer material at a high rate ("removal rate") and for forming a wafer with high surface uniformity is a uniform distribution of polishing fluid about the polishing surface.

In the case of CMP tools that use a rotating polishing platen and pad, one way that the polishing fluid is supplied to the polishing surface is through one or more delivery outlets that deposit the polishing fluid onto the polishing pad near the wafer leading edge. However, polishing fluid is not efficiently utilized with this type of delivery system. Due to the centrifugal force from the rotating platen the polishing fluid is quickly evacuated from the pad surface and the wasted polishing fluid must be continuously replaced. Visual examination of the polishing pad also reveals that the polishing fluid accumulates at the pad outer edge during polishing. As mentioned above, non-uniform polishing fluid distribution causes poor wafer planarization, and this problem alone necessitates an improved polishing fluid supply mechanism.

Another way that the polishing fluid is supplied to the polishing surface is through a plurality of through-holes distributed about the polishing pad. The polishing pad through-holes are in communication with a supply source via holes or passageways extending through the platen. This "through-the-pad" polishing fluid delivery system is known to provide improved polishing fluid uniformity during polishing. Through-the-pad polishing fluid delivery systems have been successfully used on "non-rotational" type CMP tools having a polishing surface not much larger than the wafer, and which moves in an orbital or reciprocating motion. However through-the-pad fluid delivery has not been shown to provide improved polishing fluid uniformity when used in conjunction with the type of CMP tool incorporating a rotating polishing pad. This is due at least in part to the relative mismatch in wafer and platen diameter. Because the polishing surface is necessarily substantially larger than the wafer in a rotating polishing pad CMP tool, usually more than twice the wafer diameter, some polishing pad through-holes are covered by the wafer that is being polished, while others are left uncovered. The uncovered holes are naturally passages of lesser resistance, and consequently, little if any polishing fluid is delivered directly to the wafer-pad interface during polishing, while large amounts of slurry is wasted through the uncovered holes.

Accordingly, it is desirable to provide a CMP polishing fluid supply mechanism that enables substantially uniform polishing fluid distribution about a pad-wafer interface during polishing on a rotating platen type polishing apparatus. In addition, it is desirable to provide a CMP polishing fluid supply mechanism that efficiently utilizes the polishing fluid. Furthermore, other desirable features and characteristics of the present invention will become apparent from the subsequent detailed description and the appended claims, taken in conjunction with the accompanying drawings and the foregoing technical field and background.

BRIEF SUMMARY

An apparatus is provided for performing a chemical-mechanical process on a workpiece surface. The apparatus comprises a platen having a top surface and at least one inlet configured to receive a polishing fluid, a plurality of holes formed in the top surface, a manifold system in fluid communication with the at least one inlet and each of the holes, a controller adapted to supply valve command signals, and a plurality of valves, each valve being disposed in one of the holes and coupled to the controller to receive the valve command signals and being operable, in response thereto, to selectively move between an open and a closed position.

A platen is also provided for performing a chemical-mechanical polishing process on a workpiece surface. The platen comprises a top surface having a plurality of holes formed therein, at least one inlet configured to receive a polishing fluid, a manifold system in fluid communication with the at least one inlet and each of the holes, and a plurality of valves, each valve being disposed in one of said holes and being adapted to receive the valve command signals and operable, in response thereto, to selectively move between an open and a closed position.

A method is also provided for distributing a polishing fluid to a workpiece surface using a chemical-mechanical polishing platen having a top surface, a plurality of holes formed in the top surface, and a plurality of valves, each valve being disposed in one of said holes. The method comprises the steps of supplying valve command signals from a controller to the valves, and selectively opening and closing the valves in response to the valve command signals to control fluid distribution to the workpiece surface.

BRIEF DESCRIPTION OF THE DRAWINGS

The present invention will hereinafter be described in conjunction with the following drawing figures, wherein like numerals denote like elements.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
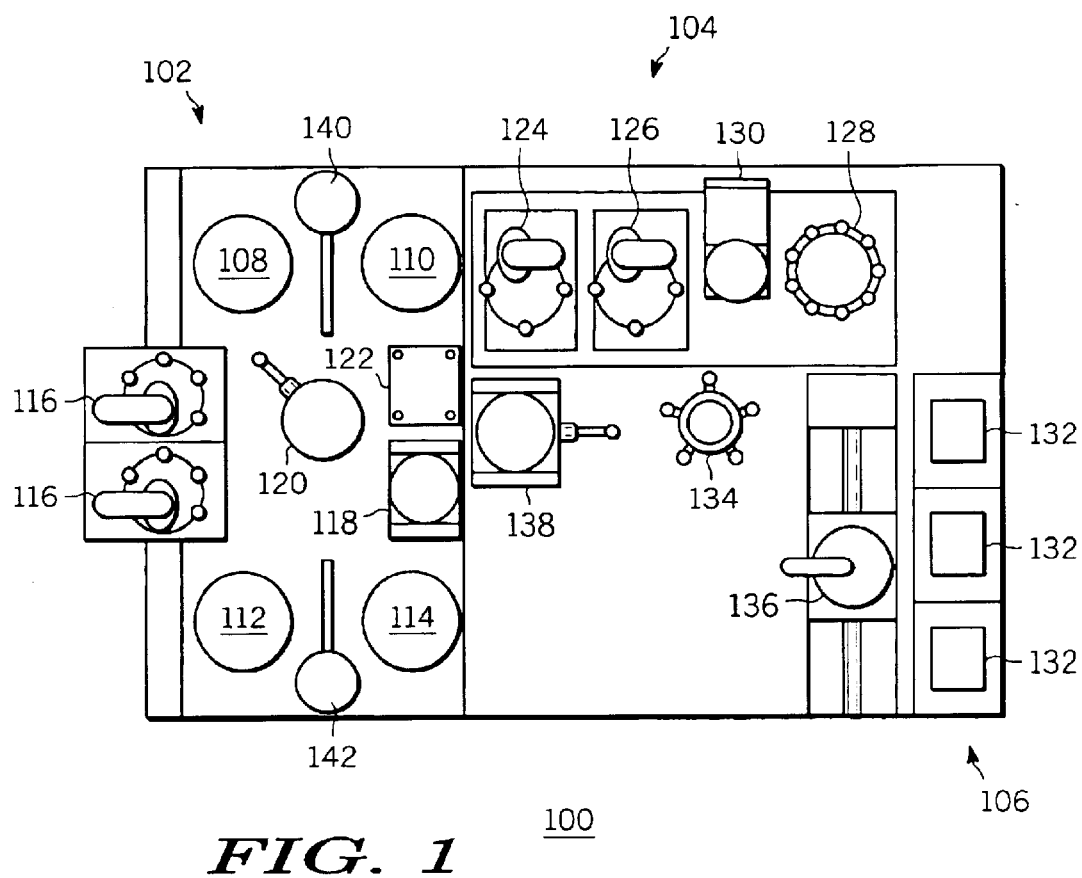
FIG. 1 is a top cutaway view of a polishing system in accordance with an embodiment of the present invention.

FIG. 1 illustrates a top cutaway view of a CMP polishing apparatus 100. The apparatus 100 depicted is suitable for polishing or planarizing material from the surface of a workpiece and can incorporate the fluid distribution system of the present invention. The apparatus 100 includes a multi-station polishing system 102, a clean system 104, and a wafer load/unload station 106. In addition, the apparatus 100 includes a cover (not shown) that surrounds the apparatus 100 to isolate the apparatus 100 from the surrounding environment. The apparatus 100 may be any machine capable of removing material from a workpiece surface.

Although the present invention may be used to remove or polish material from the surface of a variety of workpieces such as magnetic disks, optical disks, and the like, the invention is conveniently described below in connection with removing material from the surface of a wafer. In the context of the present invention, the term "wafer" shall mean semiconductor substrates, which may include layers of insulating, semiconductor, and conducting layers or features formed thereon and used to manufacture microelectronic devices.

An exemplary polishing system 102 includes four polishing stations, 108, 110, 112, and 114, that operate independently; a buff station 116; a stage 118; a robot 120; and optionally, a metrology station 122. Polishing stations 108–114 may be configured as desired to perform specific functions.

The polishing system 102 also includes polishing surface conditioners 140 and 142. The configuration of the conditioners 140 and 142 generally depends on the type of polishing surface to be conditioned. For example, when the polishing surface comprises a polyurethane polishing pad, conditioners 140 and 142 may include a rigid substrate coated with diamond material. Various other surface conditioners may also be used in accordance with the present invention.

The clean system 104 is generally configured to remove debris such as polishing fluid residue and material from the wafer surface during polishing. In accordance with the illustrated embodiment, the system 104 includes clean stations 124 and 126, a spin rinse dryer 128, and a robot 130 configured to transport the wafer between the clean stations 124 and 126 and the spin rinse dryer 128. Alternatively, the clean station 104 may be separate from the remainder of the planarization apparatus. In this case, the load station 106 is configured to receive dry wafers for processing, but the wafers may remain in a wet (e.g., deionized water) environment until the wafers are transferred to the clean station. In operation, cassettes 132, including one or more wafers, are loaded onto apparatus 100 at station 106. The wafers are then individually transported to a stage 134 using a dry robot 136. A wet robot 138 retrieves a wafer at the stage 134 and transports the wafer to metrology station 122 for film characterization or to the stage 118 within the polishing system 102. The robot 120 picks up the wafer from the metrology station 122 or the stage 118 and transports the wafer to one of the polishing stations 108–114 for wafer surface planarization. After a desired amount of material has been removed, the wafer may be transported to another polishing station.

After material has been removed from the wafer surface, the wafer is transferred to the buff station 116 to further polish the surface of the wafer. After the polishing and/or buff process, the wafer is transferred to the stage 118 which is configured to maintain one or more wafers in a wet (e.g. deionized water) environment.

After the wafer is placed on the stage 118, the robot 138 picks up the wafer and transports it to the clean system 104. In particular, the robot 138 transports the wafer to the robot 130, which in turn places the wafer in one of the clean stations 124, 126. The wafer is there cleaned and then transported to the spin rinse dryer 128 to rinse and dry the wafer prior to transporting it to the load/unload station 106 using the robot 136.

Figure 2:
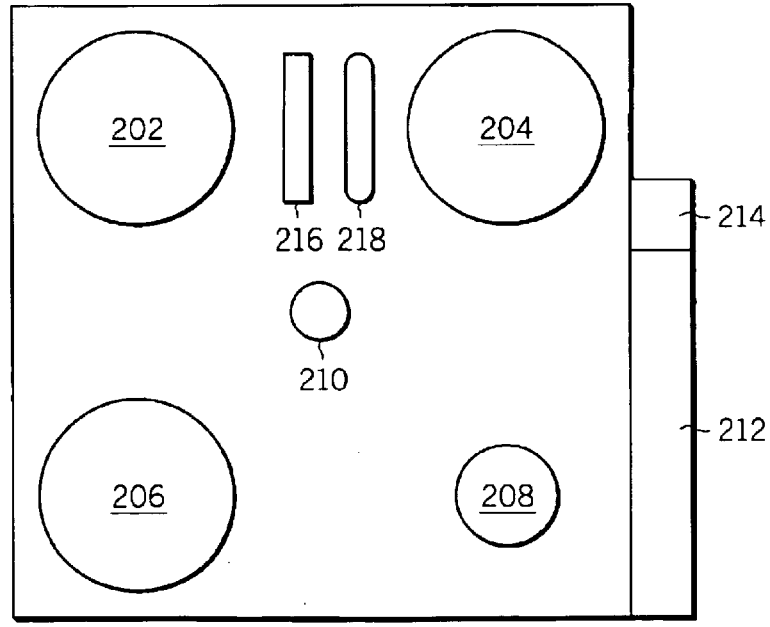
FIG. 2 is a top cutaway view of a portion of a polishing apparatus in accordance with an embodiment of the present invention.
Figure 3:
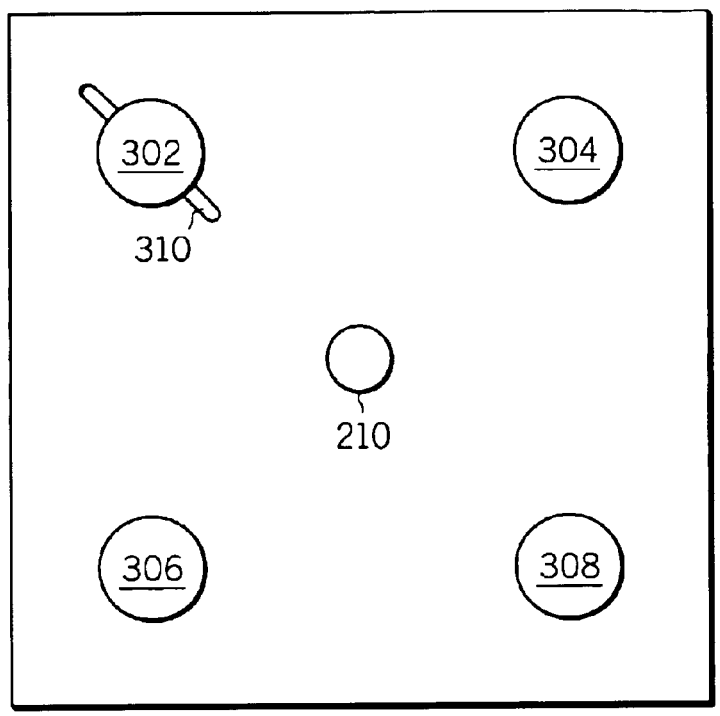
FIG. 3 is a bottom cutaway view of a carousel for use with the apparatus depicted in FIG. 2.

FIG. 2 illustrates a top cut away view of another exemplary polishing apparatus 200, configured to planarize a wafer. The apparatus 200 is suitably coupled to a carousel 300 illustrated in FIG. 3 to form an automated polishing system. The system in accordance with this embodiment may also include a removable cover (not shown) overlying the apparatus 200 and the carousel 300.

The apparatus 200 includes three polishing stations, 202, 204, and 206, a wafer transfer station 208, a center rotational post 210 that is coupled to carousel 300 and which operatively engages carousel 300 to cause carousel 300 to rotate, a load and unload station 212, and a robot 214 configured to transport wafers between stations 212 and 208. Furthermore, the apparatus 200 may include one or more rinse washing stations 216 to rinse and/or wash a surface of a wafer before or after a polishing, process. Although illustrated with three polishing stations, the apparatus 200 may include any desired number of polishing stations, and one or more such polishing stations may be used to buff a surface of a wafer.

Furthermore, the apparatus 200 may include an integrated wafer clean and dry system similar to the system 104 described above. The wafer station 208 is generally configured to stage wafers before or between polishing and/or buff operations and may be further configured to wash and/or maintain the wafers in a wet environment.

The carousel 300 includes polishing heads, or carriers, 302, 304, 306, and 308, each configured to hold a single wafer and urge the wafer against the polishing surface (e.g., a polishing surface associated with one of stations 202–206). Each carrier 302–308 is suitably spaced from post the 210 such that each carrier aligns with a polishing station or the wafer station 208. In accordance with one embodiment of the invention, each carrier 302–308 is attached to a rotatable drive mechanism that allows the carriers 302–308 to cause a wafer to rotate (e.g., during a polishing process). In addition, the carriers may be attached to a carrier motor assembly that is configured to cause the carriers to translate as, for example, along tracks 310. Furthermore, each carrier 302–308 may rotate and translate independently of the other carriers.

In operation, wafers are processed using the apparatus 200 and carousel 300 by loading a wafer onto the station 208 from the station 212 using the robot 214. When a desired number of wafers are loaded onto the carriers, at least one of the wafers is placed in contact with the polishing surface. The wafer may be positioned by lowering a carrier to place the wafer surface in contact with the polishing surface, or a portion of the carrier (e.g., a wafer holding surface) may be lowered to position the wafer in contact with the polishing surface. After polishing is complete, one or more conditioners 218 may be employed to condition the polishing surfaces.

Figure 4:
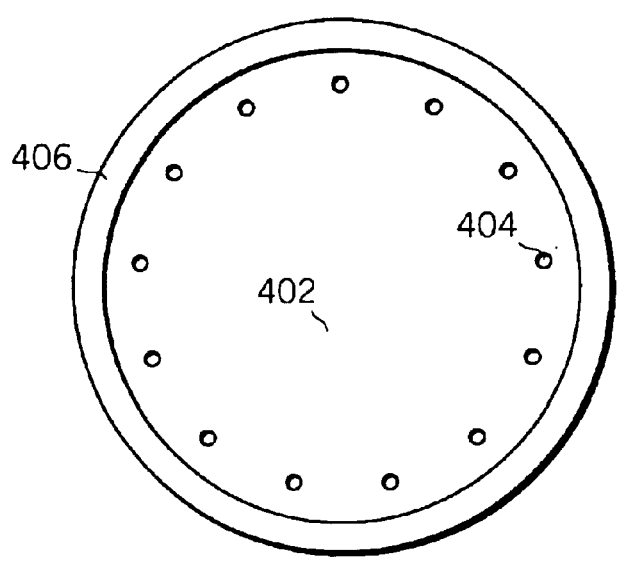
FIG. 4 is a top plan view of a typical workpiece carrier for use in conjunction with a polishing apparatus.

During a polishing process, a wafer may be held in place by a carrier 400, illustrated in FIG. 4. The carrier 400 comprises a retaining ring 406 and a receiving plate 402 including one or more apertures 404. The apertures 404 are designed to assist retention of a wafer by the carrier 400 by, for example, allowing a vacuum pressure to be applied to the backside of the wafer or by creating enough surface tension to retain the wafer. The retaining ring 406 limits the movement of the wafer during the polishing process.

Figure 5:
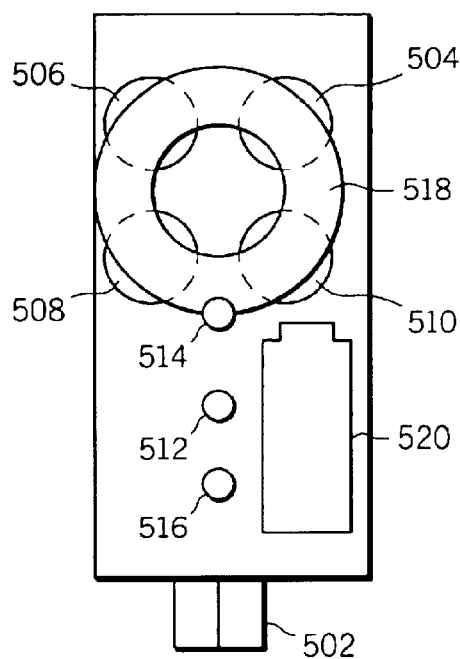
FIG. 5 is a top cutaway view of apportion of a polishing apparatus in accordance with still another embodiment of the present invention.

FIG. 5 illustrates another polishing system 500 in accordance with the present invention. It is suitably configured to receive a wafer from a cassette 502 and return the wafer to the same or to a predetermined different location within the cassette in a clean common dry state. The system 500 includes polishing stations 504 and 506, a buff station 508, a head loading station 510, a transfer station 512, a wet robot 514, a dry robot 516, a rotatable index table 518, and a clean station 520. The dry robot 516 unloads a wafer from the cassette 502 and places the wafer on the transfer station 512. The wafer then travels to the polishing stations 504–508 for polishing and returns to the station 510 for unloading by the wet robot 514 and the transfer station 512. The wafer is then transferred to the clean system 520 to clean, rinse, and dry the wafer before the wafer is returned to the load and unload station 502 using the dry robot 516.

Figure 6:
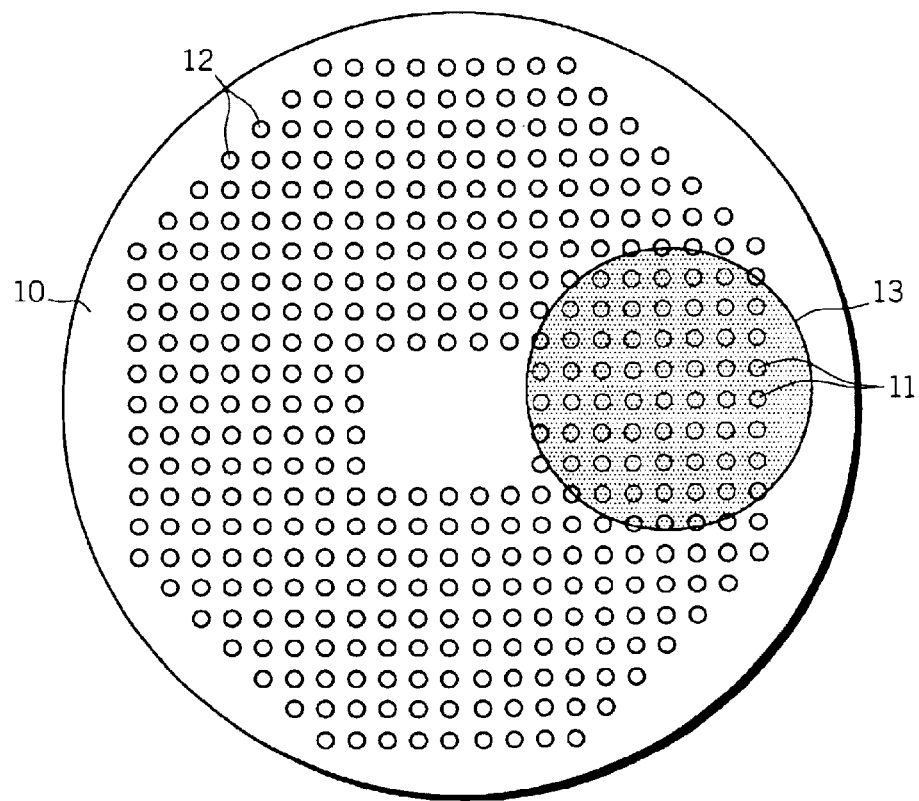
FIG. 6 is a top view of a platen for use in a chemical-mechanical polishing apparatus according to an embodiment of the present invention.

Turning now to the polishing fluid delivery system of the present invention, FIG. 6 illustrates a rotatable platen 10 having a pattern of polishing fluid delivery holes therein. Although not shown, a CMP pad is provided on top of the platen 10 during use. It should be noted that the term "CMP pad" is used here purely for convenience, and is intended to more broadly cover any type of polishing, electropolishing, buffing, or cleaning pad disposed on a platen and used in conjunction with a suitable polishing, buffing, or cleaning fluid or slurry. The CMP pad includes a polishing surface for polishing a wafer or other workpiece, hereinafter generally referred to as a "wafer." The CMP pad also includes through holes that are arranged in a pattern that matches the platen hole pattern so that the platen polishing fluid delivery holes are in fluid communication with the CMP through holes.

FIG. 6 illustrates with shading an area 13 that is covered by the wafer at some time as the wafer is being polished. When the area 13 is covered, polishing fluid delivery holes 11 within the area 13 are open and deliver polishing fluid to the CMP pad top surface. All holes 12 that are not disposed within the area 13 are closed and consequently do not deliver polishing fluid to the CMP pad top surface. Consequently, the open holes 11 covered by the wafer form the only polishing fluid pathways to the CMP pad top surface.

The selectively opening and closing polishing fluid delivery holes 11, 12 function to create an even polishing fluid distribution along the CMP pad/wafer interface during wafer polishing. The even polishing fluid distribution is a result of the polishing fluid pathways through each of the open holes 11 having substantially equal amounts of flow resistance since the wafer covering the holes 11 is essentially flat. Also, because the platen 10 rotates, all of the holes 11, 12 are covered by the wafer at some time during a single rotation of the platen, thereby utilizing the entire polishing surface of the CMP pad.

Figure 8:
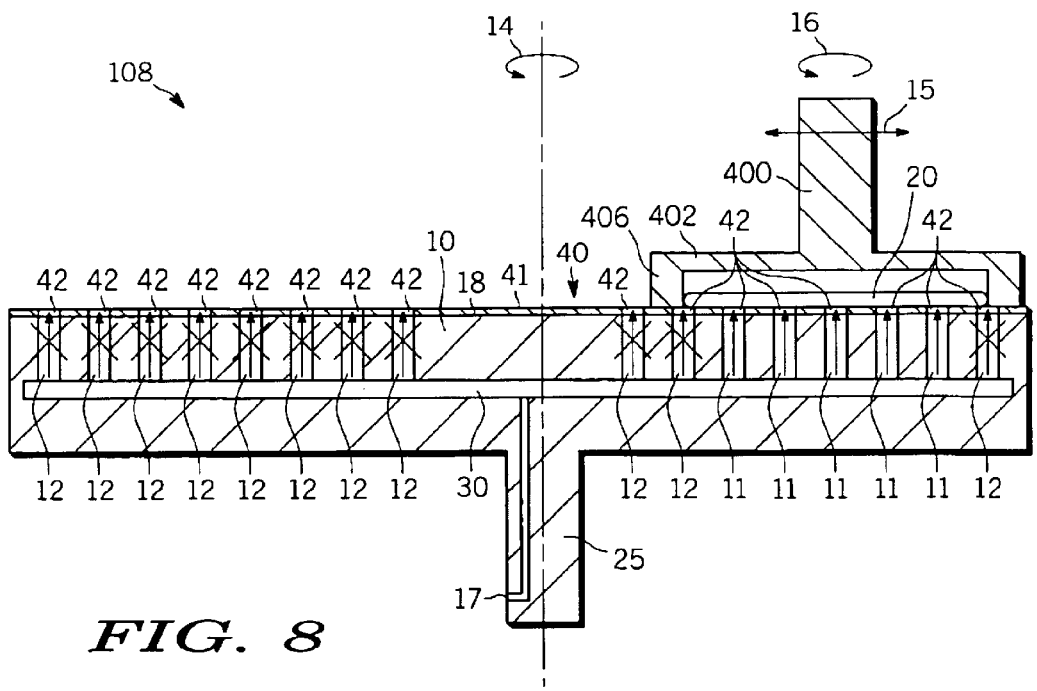
FIG. 8 is a cross sectional view of the platen depicted in FIG. 6.

FIG. 8 depicts the coordinated elements within a polishing station designated 108, although the illustrated polishing station 108 may be representative of any of the above mentioned polishing stations 110, 112, 114, 202, 204, 206 or other conventional polishing stations to the extent that the polishing station features are commonly known in the art. As discussed above, a wafer 20 is secured in a carrier 400 that rotates during a polishing process as designated by arrow 16 and also oscillates in a radial direction relative to the platen as designated by arrow 15. The platen 10 also rotates during a polishing process as designated by arrow 14. The platen 10 is disposed on top of a rotary union 25 and houses a manifold distribution system 30. Polishing fluid is introduced to the manifold system 30 via a supply port 17 that extends through the rotary union 25 that rotatably supports the platen 10. The manifold system 30 distributes the polishing fluid about the platen interior. The manifold system 30 includes the platen holes 11, 12 through which the polishing fluid flows from the platen interior to the platen top surface 18. A CMP pad 40 is disposed on top of the platen top surface 18, and includes through-holes 42 that are contiguous with the platen holes 11, 12 and extend to a CMP pad top surface 41.

Figure 7:
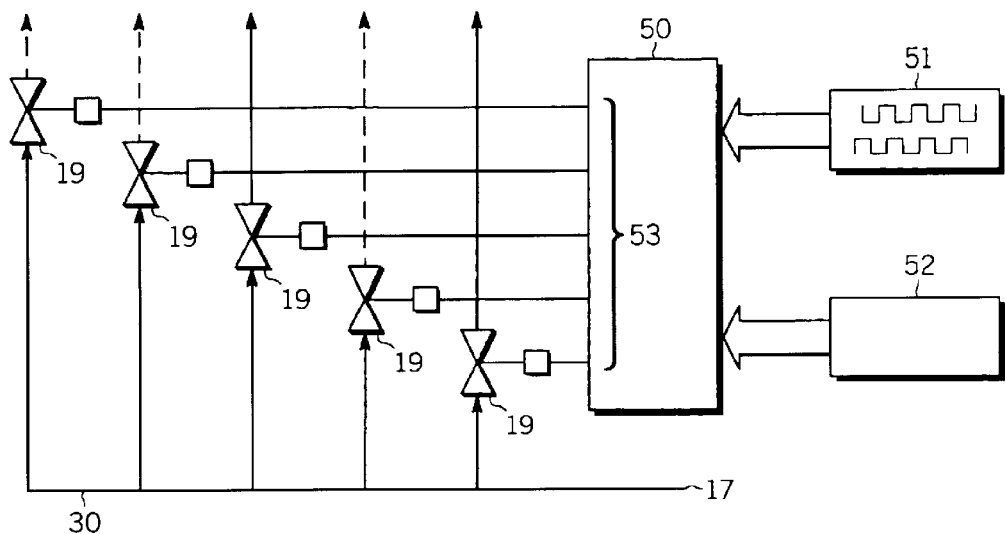
FIG. 7 is a diagram showing a control system and valves responsive to command signals from the control system according to an embodiment of the present invention.

As illustrated in FIG. 8, only the platen holes 11 that are covered by the wafer 20 are open. Valves (not shown) are disposed proximate to or inside of each of the holes 11, 12 to regulate polishing fluid passage to the platen top surface 18. Electronic components automatically control valve openings and closings. FIG. 7 is a schematic of a valve control system 50 and the valves 19 it controls according to one embodiment of the invention. In an exemplary embodiment, valves 19 open as soon as it is determined that the wafer 20 entirely covers holes in which the valves 19 are disposed. The wafer 20 only momentarily covers any given hole due to the constant motion of the platen 10 and carrier 400, so it is preferred that polishing fluid be quickly distributed to the CMP pad/wafer interface by disposing the valves 19 as close as possible to the platen top surface 18. Valve opening and closing commands may be delayed or progressed as needed in order to allow the polishing fluid to always exist at the pad-wafer interface. For example, if polishing fluid will not reach the pad-wafer interface approximately at the instant that the wafer covers a hole 11, 12, the valves 19 may be commanded to open momentarily before the wafer 20 covers the hole 11, 12.

The valve control system 50 depicted in FIG. 7 produces control signals 53 that regulate valve openings and closings. The valve control system 50 can be placed in any convenient location for communication with the valves 11, 12, but is preferably disposed within the platen 10. The command signals 53 can be based on such factors as the hole configuration data 52 for the platen, and feedback data regarding the platen's angular position relative to the wafer 20. In some cases it may be necessary to also base the command signals on data regarding the time required for polishing fluid to travel from the valves 19 to the wafer surface during polishing. The data regarding the polishing fluid travel time is a function of such determinants as the polishing fluid consistency, the depth at which the valves 19 are disposed in the platen 10, the CMP pad thickness, and the pressure exerted on the polishing fluid. The angular position and wafer position can be provided for example by a rotary encoder 51 or other conventional clocking device.

A rotary encoder 51 is positioned on an external surface or inside a cavity of the rotary union 25 in an exemplary embodiment of the invention. In another exemplary embodiment of the invention the rotary encoder 51 is positioned on an external surface or inside a cavity of the platen 10. Conventionally known optical, magnetic, or capacitive techniques can be employed to produce an electrical signal that is converted to rotary position data, and to input the data into the control system 50. The inputted data from the encoder and pertaining to the platen hole configuration and, if necessary, the distance between the valves 19 and the CMP pad top surface 41 enables the control system 50 to select a specific configuration of holes to be opened and closed at any moment and to thereby provide a uniform distribution of polishing fluid across the surface of the wafer 20 that is being polished during a polishing process.

While at least one exemplary embodiment has been presented in the foregoing detailed description, it should be appreciated that a vast number of variations exist. For example, in addition to a CMP polishing process, the present invention is equally applicable to an electro-polishing process for electrochemically polishing a metal layer such as copper on a substrate using a suitable pad and electro-active chemistry, to a wafer buffing process for buffing scratches from a polished wafer using a buffing pad and suitable buffing fluid, or to a wafer cleaning process using a suitable cleaning pad in the presence of a cleaning, etching, or rinsing solution. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. An apparatus for performing a process on a workpiece surface, comprising:
    a platen having a top surface, and at least one inlet configured to receive a polishing fluid;
    a plurality of holes formed in said top surface;
    a manifold system in fluid communication with said at least one inlet and each of said holes;
    a controller adapted to supply valve command signals; and
    a plurality of valves, with one of said valves being disposed in each of said holes and coupled to said controller to receive said valve command signals and being operable, in response thereto, to selectively move between an open and a closed position.

2. An apparatus according to claim 1, wherein said controller is adapted to supply said command signals to enable each of said valves to be in the open position when covered by said workpiece surface during said process.

3. An apparatus according to claim 2, wherein said controller is adapted to supply said command signals to enable each of said valves to be in the closed position when not covered by said workpiece surface during said process.

4. An apparatus according to claim 1, wherein said controller is adapted to receive hole configuration data pertaining to a configuration for said plurality of holes, and angular position data pertaining to an angular position for said platen, and to base said command signal on said hole configuration data and said angular position data.

5. An apparatus according to claim 4, further comprising a rotary encoder for determining said angular position and transmitting said angular position data to said controller.

6. An apparatus according to claim 5, further comprising a rotary shaft, rotatably supporting said platen and coupled to said rotary encoder.

7. An apparatus according to claim 6, wherein said rotary shaft comprises a supply port through which said polishing fluid is delivered to said inlet.

8. An apparatus according to claim 4, wherein said controller is her adapted to receive timing data pertaining to a time that is required for said polishing fluid to travel from one of said valves to said workpiece surface during said process.

9. An apparatus according to claim 1, wherein said process is selected from the group comprising chemical mechanical planarization, electro-chemical polishing, buffing, and cleaning.

10. A platen for performing a process on a workpiece surface, comprising;
    a top surface having a plurality of holes formed therein;
    at least one inlet configured to receive a polishing fluid;
    a manifold system in fluid communication with said at least one inlet and each of said holes; and
    a plurality of valves, with one of said valves being disposed in each of said holes and being adapted to receive valve command signals from a controller and operable, in response thereto, to selectively move between an open and a closed position.

11. A platen according to claim 10, further comprising:
    a controller, coupled to said platen and adapted to supply said valve command signals to each of said valves.

12. A platen according to claim 11, wherein said controller is adapted to supply said command signals to enable each of said valves to be in the open position when covered by said workpiece surface during said process.

13. A platen according to claim 11, wherein said controller is adapted to supply said command signals to enable each of said valves to be in the closed position when not covered by said workpiece surface during said process.

14. A platen according to claim 11, wherein said controller is adapted to receive hole configuration data pertaining to a configuration for said plurality of holes, and angular position data pertaining to an angular position for said platen, and to base said command signal on said hole configuration data and said angular position data.

15. A platen according to claim 14, further comprising a rotary encoder, coupled to said platen and adapted for determining said angular position and transmitting said angular position data to said controller.

16. A platen according to claim 14, wherein said controller is further adapted to receive timing data pertaining to a time that is required for said polishing fluid to travel from one of said valves to said workpiece surface during said polishing process.

17. The platen according to claim 10, wherein said process is selected from the group comprising chemical mechanical planarization, electrochemical polishing, buffing, and cleaning.

18. An apparatus for performing a process on a workpiece surface, comprising:

a platen having a top surface, and al least one inlet configured to receive a polishing fluid;

a plurality of holes formed in said top surface;

a manifold system in fluid communication with said at least one inlet and each of said holes;

controller means for providing valve command signals; and valve means for controiling said fluid in each of said holes individually and separately and disposed in each of said holes, said valve means being coupled to said controller means for providing valve command signals, and being operable, in response thereto, to selectively move between an open and a closed position.

* * * * *